(12) United States Patent
Gordon et al.

(10) Patent No.: US 6,522,542 B1
(45) Date of Patent: Feb. 18, 2003

(54) POWER DISTRIBUTION PANEL WITH HEAT SINK

(75) Inventors: Richard A. Gordon, Chaska; Ronald Robert Kurth, Brooklyn Park, both of MN (US); Delfino Hernandez, Juarez (MX); David E. Schomaker, Lino Lakes, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/527,897

(22) Filed: Mar. 20, 2000

(51) Int. Cl.[7] ................................................. H05K 7/20
(52) U.S. Cl. ........................ 361/704; 257/724; 361/722
(58) Field of Search ................................ 340/500, 506, 340/815, 45; 307/64, 66; 363/141; 257/706, 707, 713, 723, 724; 361/704, 705, 709–711, 717–719, 722

(56) References Cited

U.S. PATENT DOCUMENTS

| | | | | |
|---|---|---|---|---|
| 3,622,700 A | * | 11/1971 | Goetz, Jr. | |
| 4,218,724 A | * | 8/1980 | Kaufman | 361/736 |
| 5,821,636 A | * | 10/1998 | Baker et al. | 307/70 |
| 5,949,493 A | * | 9/1999 | Mudra | |
| 6,025,993 A | * | 2/2000 | Wakabayashi et al. | 361/705 |
| 6,038,129 A | | 3/2000 | Falaki et al. | |
| 6,046,921 A | * | 4/2000 | Tracewell et al. | 363/141 |
| 6,084,178 A | * | 7/2000 | Cromwell | 174/35 R |
| 6,147,867 A | | 11/2000 | Gaudrel et al. | |

FOREIGN PATENT DOCUMENTS

| | | |
|---|---|---|
| DE | 197 01 854 C 1 | 5/1998 |
| EP | 0 918 452 A1 | 5/1999 |
| EP | 0 954 210 A1 | 11/1999 |
| JP | 08280106 | 10/1996 |
| TW | 301429 | 3/1997 |

OTHER PUBLICATIONS

Hendry Telephone Products document, 2 pages, entitled "Power Distribution, Flexible Series," dated Feb. 1998, pp. 6 and 7.
Hendry Telephone Products document, 2 pages, entitled "Power Distribution, High Density," dated Feb. 1998, pp. 9 and 10.
Hendry Telephone Products document, 2 pages, entitled "Power Distribution, Intelligent," dated Feb. 1998, pp. 17 and 18.
Hendry Telephone Products document, 2 pages, entitled "Power Distribution, Traditional," dated Feb. 1998, pp. 23 and 24.
Telect.com catalog page entitled "Uninterrupted Battery Fuse Panel," , copyright 1999, p. 7.
Telect.com catalog pages entitled "Intermediate Fuse Panels," copyright 1999, pp. 8.
Telect.com catalog, 2 pages entitled "Circuit Breaker Panel," copyright 1999, pp. 9 and 10.
Telect.com catalog, 2 page entitled "High Current Circuit Breaker Panel,"copyright 1999, p. 11 and 12.
Telect.com brochure, 2 pages, entitled "Two Fuse Panels in One Rack Space– Intermediate Fuse Panel," dated Jul. 1998.
Printouts from www.telect.com dated Mar. 22, 2000, entitled "Telect, Fuse Panels", 2 pages.

(List continued on next page.)

Primary Examiner—Gerald Tolin
(74) Attorney, Agent, or Firm—Merchant & Gould P.C.

(57) ABSTRACT

A power distribution panel with a heat sink integrated as a portion of a surface of the power distribution panel and a heat generating component of an electrical circuit within the power distribution panel being connected to the heat sink to allow heat conduction away from the heat generating component.

27 Claims, 7 Drawing Sheets

OTHER PUBLICATIONS

Printouts from www.telect.com dated Mar. 22, 2000, entitled "Telect's Traditional Fuse Panels," 3 pages.

Printouts from www.telect.com dated Mar. 22, 2000, entitled "Telect's Total Front Access Fuse Panels," 2 pages.

Printouts from www.telect.com dated Mar. 22, 2000, entitled "Telect's Intermediate Fuse Panels," 2 pages.

Printouts from www.telect.com dated Mar. 22, 2000, entitled "Telect, Circuit Breaker Panel," 2 pages.

Printouts from www.telect.com dated Mar. 22, 2000, entitled "Telect's Circuit Breaker Panel," 2 pages.

Printouts from www.telect.com dated Mar. 30, 2000, entitled "Telect's Uninterrupted Battery Fuse Panel," 4 pages.

International Rectifier document, 4 pages, entitled "Schottky Rectifier, 163CMQ Series," dated Dec. 1997.

International Rectifier document, 2 pages, entitled "Schottky Rectifier, 203CMQ Series,"0 dated Jun. 1998.

* cited by examiner

POWER DISTRIBUTION PANEL WITH HEAT SINK

BACKGROUND OF THE INVENTION

Electrical circuit panels such as power distribution panels typically employ circuit components which generate heat. For safety and other reasons, electrical circuit panels often are enclosed within a housing structure. The heat generated by the components of the electrical circuit panels can be trapped within the housing and can impair the performance of an electrical circuit or even destroy sensitive circuit components. Heat buildup can also cause electrical fires. Therefore cooling systems are important elements in many electrical circuit panels.

Prior art circuit panels have employed fans or blowers to dissipate heat and ventilate the interior of a circuit panel. Such systems add significantly to the complexity and expense of the circuit panels. Other prior art systems have employed convection cooling by coupling the heat generating component to a heat conductor, called a heat sink, located inside the fuse panel which carries the heat away from the heat generating component. Typically, the panel encloses a metal bar or plate which is connected to the heat generating electrical component by a heat conductive transfer element. However, adding heat conducting elements inside the circuit panel increases the expense, complexity, and cost of the panel and impedes access to the circuitry of the panel during assembly, installation, and maintenance. Also such a construction is not efficient for heat convection away from the panel since the heat sink is located inside the panel enclosure.

SUMMARY OF THE INVENTION

The present invention is a circuit panel, such as a power distribution panel including a convection heat sink which forms a portion of a housing structure of the panel. The power distribution panel may include fuse holder locations in order to act as a fuse panel or circuit breakers or a combination of both. The power distribution panel is generally rectangular in shape with fuse holder locations, power input connections, and output connector locations disposed on a surface of the panel, all electrically connected via an electrical circuit. The present invention integrates a heat sink with a housing surface of the circuit panel to dissipate heat generated by a component of the electrical circuit. The heat generating component of the electrical circuit is coupled directly to the heat sink surface of the circuit panel.

DETAILED DESCRIPTION OF THE PREFERRED EMBODIMENTS

A power distribution panel is a circuit panel which channels power from a supply line to a number of different pieces of equipment. Therefore, a power distribution panel typically has one or more power input connections and an array of output connections to which the pieces of equipment to be supplied with power are connected. The typical power distribution panel also comprises an array of fuse locations, normally one fuse location for each output connection. Alternatively, or in combination, circuit protection may be provided by circuit breakers. This specification and accompanying drawings concern preferred embodiments of a power distribution fuse panel but it is to be understood that the present invention is applicable to other types of circuit panels such as circuit breaker panels, other circuit protection panels, or other circuit functions altogether.

As shown in FIGS. 1–6, the present invention relates to a power distribution fuse panel 1 (hereinafter referred to as fuse panel 1) having a housing or enclosure 2 with a front surface 10, a back surface 14, a top surface 18, a bottom surface 22 and two side surfaces 24. The embodiment shown in FIGS. 1–6 shows two arrays of fuse holders 12 and fuses 13 on the front surface 10, and on the back surface 14 are two arrays of output terminals 16 as well as two power input connections 28. The output terminals 16 are electrically connected to the power input connections 28 and the fuse holders 12 by means of an electrical circuit within housing 2, an example of which is shown in FIG. 7.

In the present invention, a heat sink 20 forms a portion of the top surface 18 of the fuse panel. The heat sink 20 acts to conduct heat away from a heat generating component 26 of the electrical circuit of the fuse panel, the heat generating component being mounted to the heat sink. Because the heat sink 20 forms a surface of the fuse panel, the heat sink 20 dissipates the heat directly to the open air outside the fuse panel.

Figure 6:
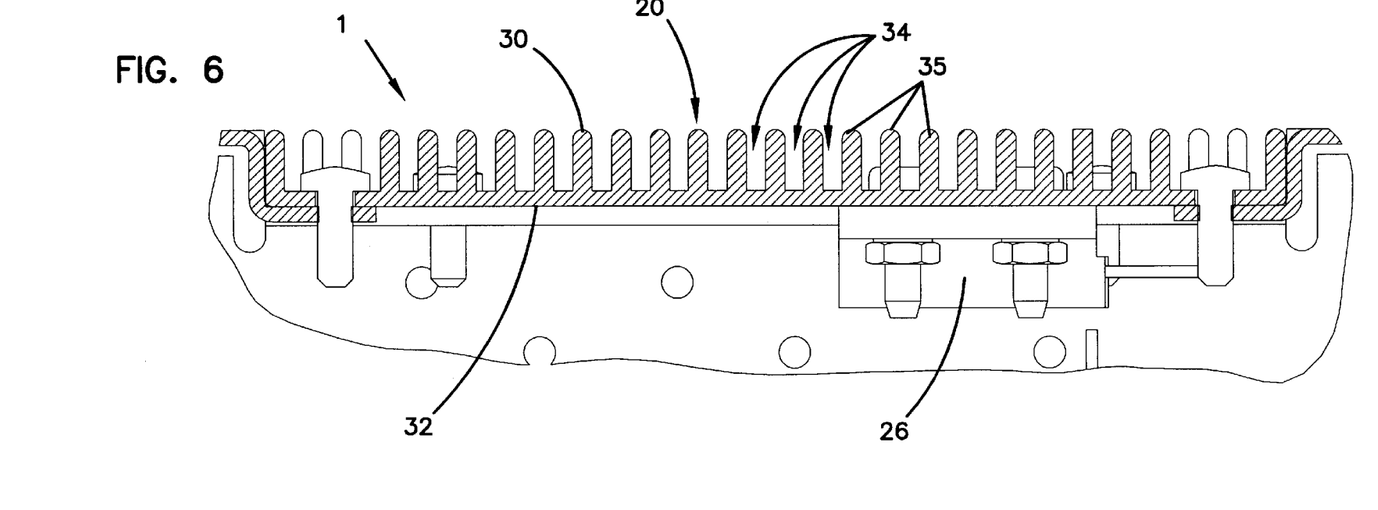
FIG. 6 is a detail from FIG. 5 showing the heat sink and heat generating component configured according to the present invention.
Figure 7:
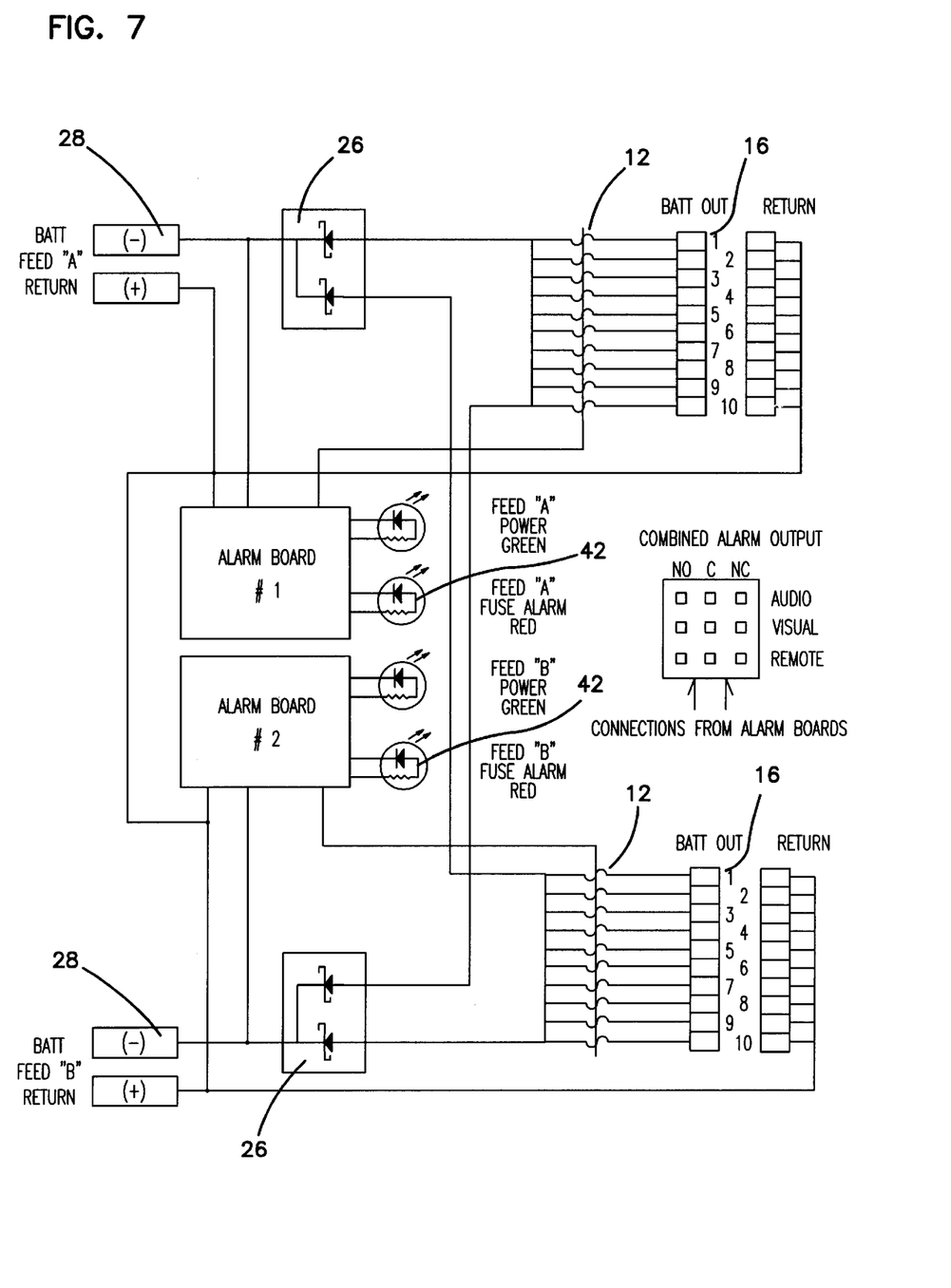
FIG. 7 is an electrical circuit used in a power distribution panel of the present invention.

Referring now to FIG. 6, a top side 30 of the heat sink 20 defines a pattern of grooves 34. A bottom side 32 of the heat sink 20 is flat enabling a heat generating component 26 such as a Schottky steering and rectifying diode to be mounted to the bottom side 32 of the heat sink 20. The grooves 34 provide an increased surface area and assist in dissipating heat conducted by the heat sink 20 away from the heat generating component 26. The grooves 34 and resulting longitudinal fins or projections 35 provide a more rigid panel section over a thin sheet metal shape, thereby strengthening the fuse panel. The heat sink 20 is perforated, thereby defining mounting apertures 40 for mounting the heat generating components 26 to the heat sink 20. The top surface 18 may also define vents or openings 38 to aid in cooling and ventilating the fuse panel. The heat sink 20 includes further perforations 41 for receiving fasteners 43 to mount to tabs 45 of a remainder of housing 2. As shown best in FIGS. 5 and 6, the heat sink 20 of the preferred embodiment is recessed into the enclosure 2, presenting a generally planar top surface to panel 20. No fins 35 project beyond the top surface 18.

Figure 1:
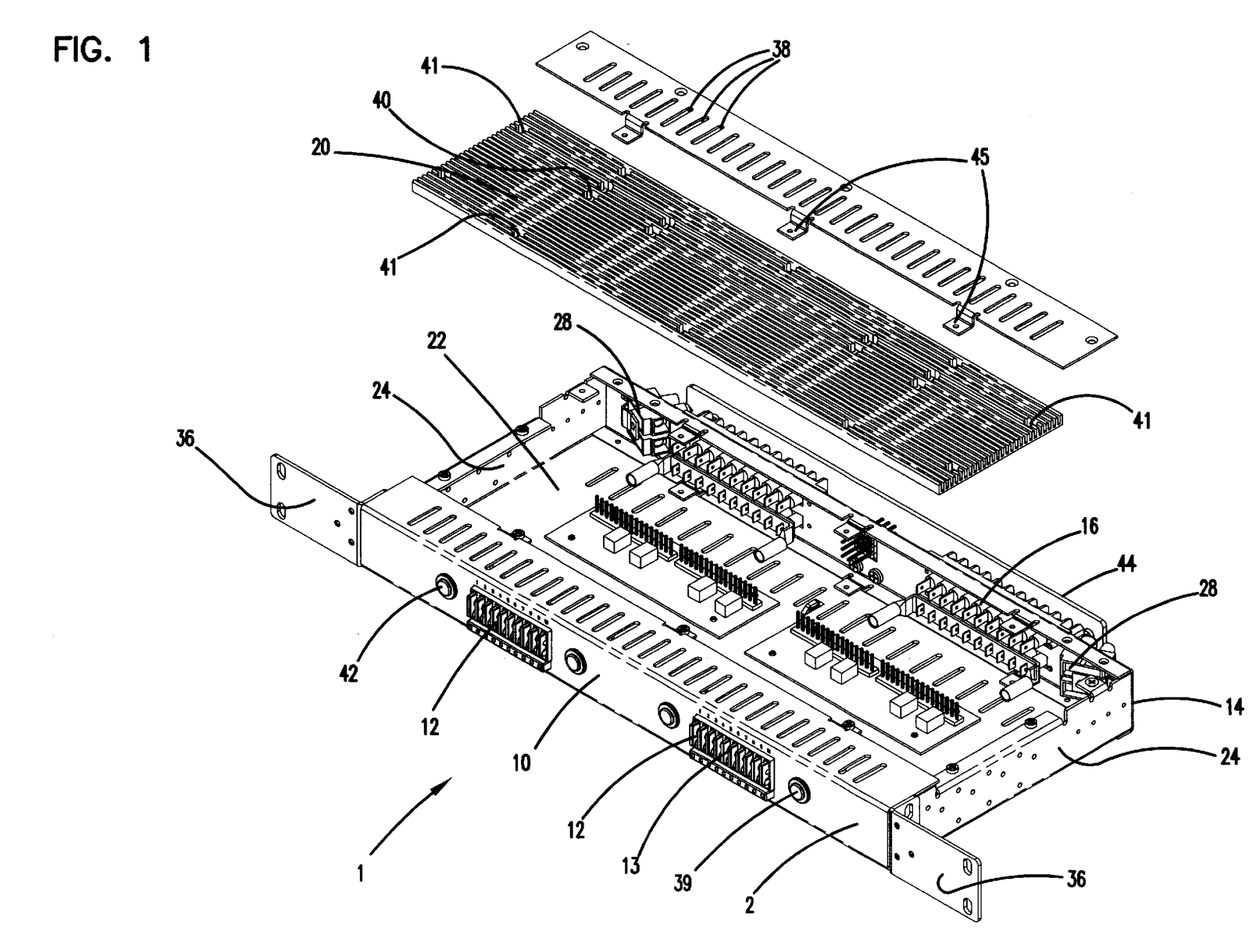
FIG. 1 is an exploded view of one preferred embodiment of a power distribution panel with heat sink according to the present invention.

The power input connections 28 are configured to accept electrical power supply lines. The power input connections 28 may be configured as two hole compression lug-stud type connections or set screw barrel connections or other connectors known in the art. FIG. 1 shows panel 1 with power input connections 28 configured as set screw barrel type. FIGS. 2–6 show two hole compression lug-stud type power input connections 28. A protective rear panel 44 is used as a safety precaution to cover the power input connections 28 and the output connector locations 16. The rear panel 44 is removed in FIG. 2 to allow viewing of the rear panel features. The rear panel 44 of FIG. 1 is not as long as the rear panel 44 of FIG. 3 since a longer panel is more preferred for protection purposes for the two hole lug-stud connector types.

Figure 2:
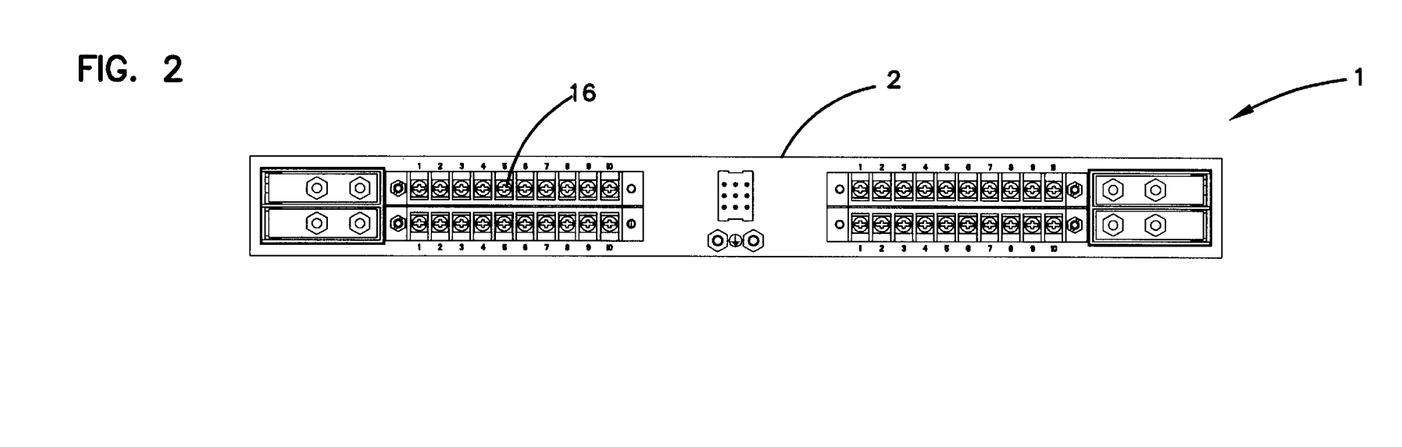
FIG. 2 is a rear view of the preferred embodiment of the power distribution panel of FIG. 1 with heat sink slightly modified according to the present invention.
Figure 3:
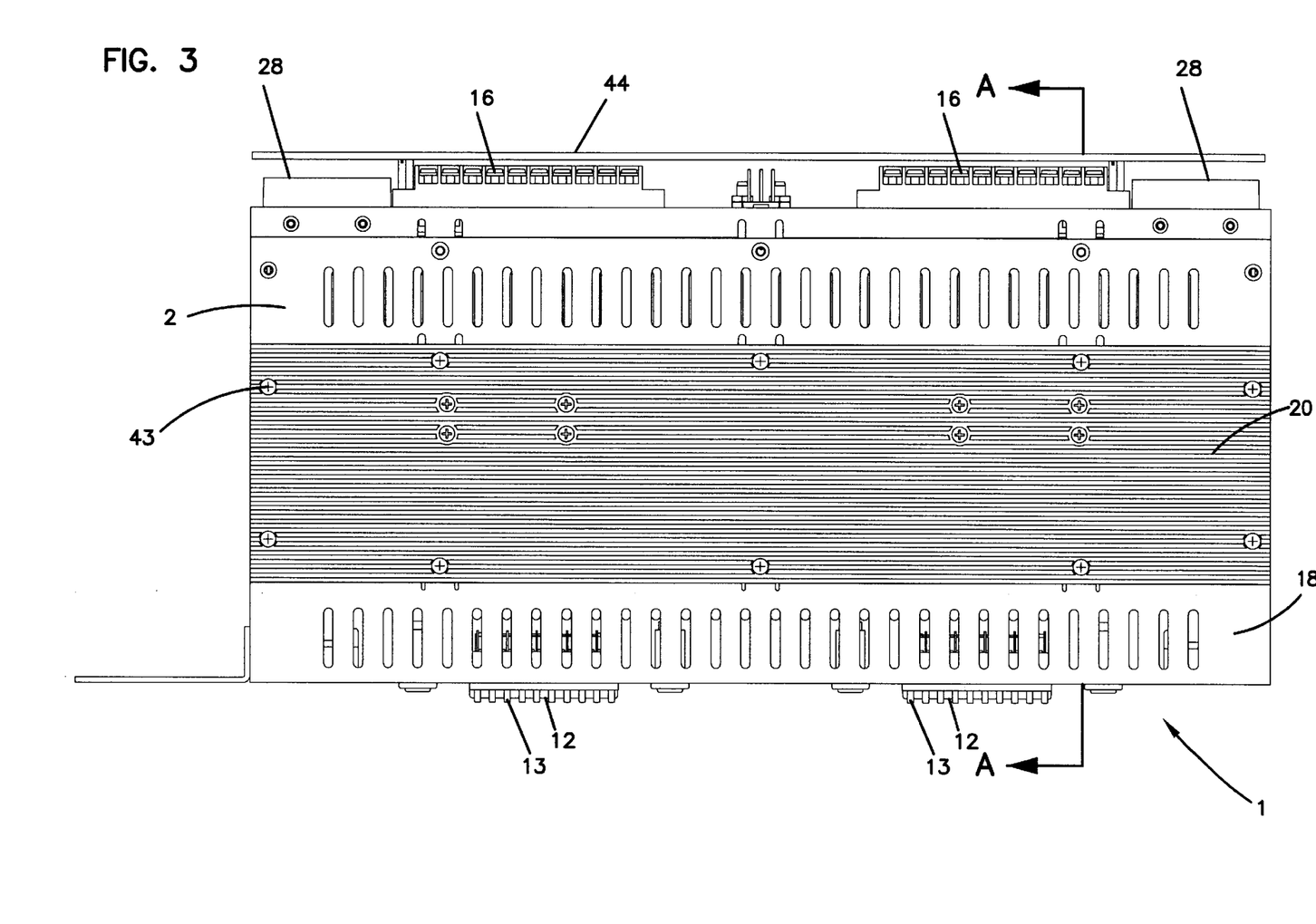
FIG. 3 is a top view of the preferred embodiment of the power distribution panel of FIG. 2 with heat sink according to the present invention.
Figure 4:
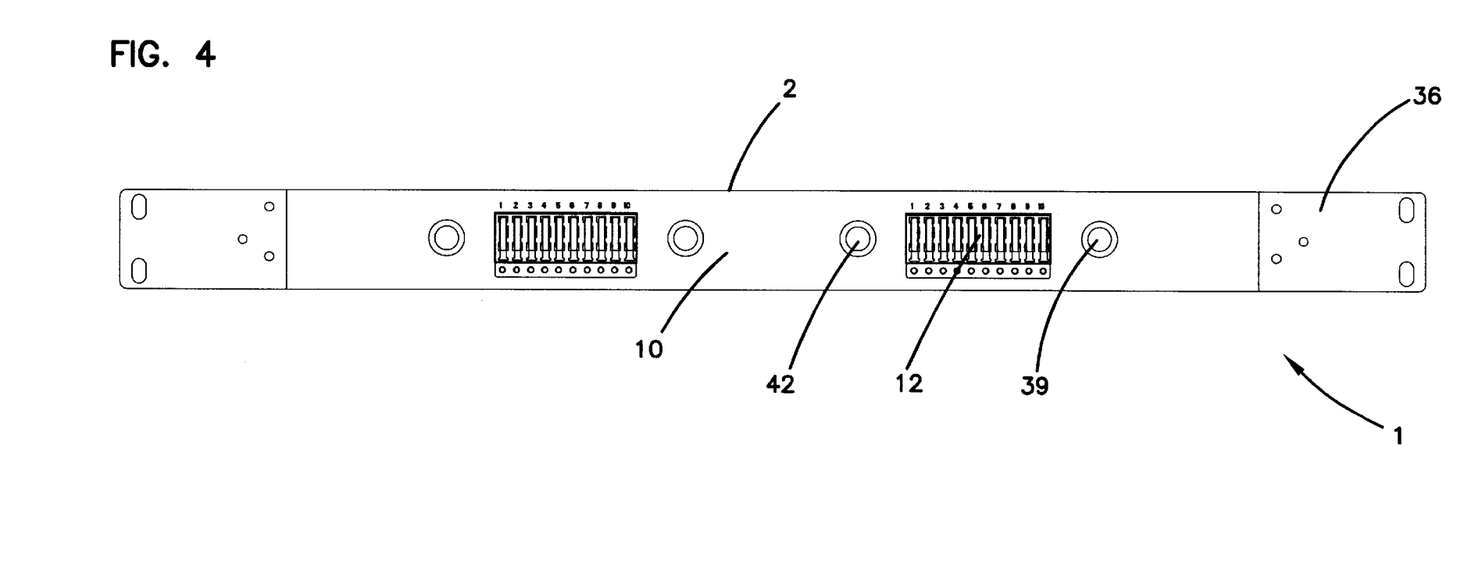
FIG. 4 is a front view of the preferred embodiment of the power distribution panel of FIG. 2 with heat sink according to the present invention.
Figure 5:
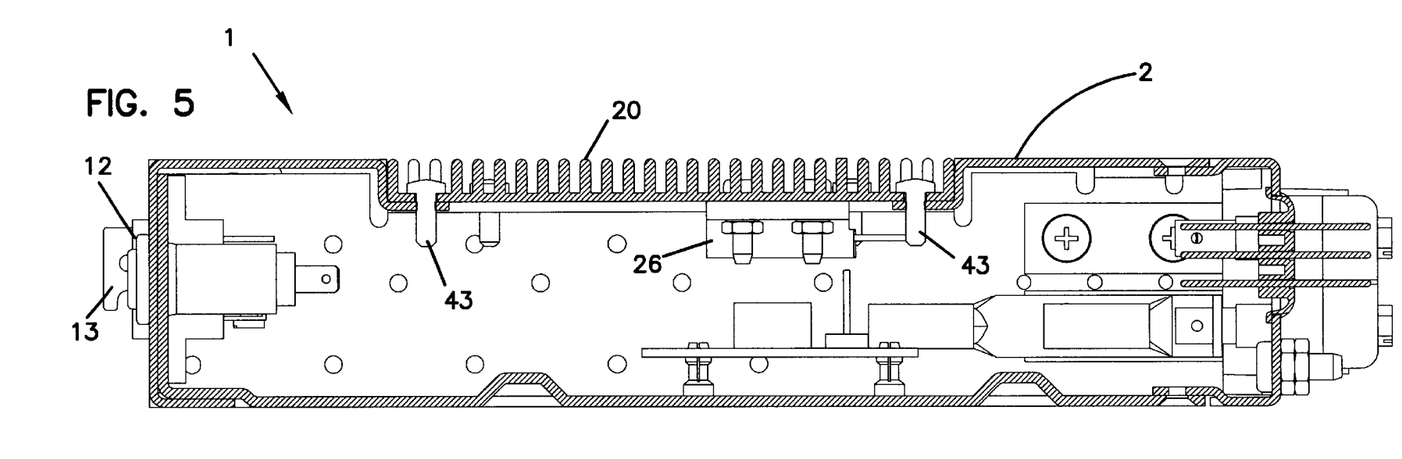
FIG. 5 is a cross-sectional side view defined by line A—A in FIG. 3.

The fuse holder locations 12 may be configured to accept industry standard fuses such as GMT, Type 70, KTK, KLM, TPA, TPS fuses or others. Instead of fuses the power distribution panel may include circuit breakers. In FIG. 7, the fuses 12 would be replaced with circuit breaker components. The output connector locations 16 may be screw-down barrier terminal strip type connectors as are shown in FIG. 2 or a set-screw barrel terminal strip or even ring terminals, or other connector types.

The circuit shown in FIG. 7 is configured to provide redundant power to fused equipment through Schottky steering diodes. The Schottky diodes are significant heat generating components of the circuit within the fuse panel, and therefore, according to the present invention, the two Schottky diodes are attached to the heat sink 20. In a redundant or uninterrupted power distribution fuse panel, the panel receives input power from two sources. The electrical circuit is configured with the Schottky steering diodes so that if the supply of power from one power source is interrupted, the Schottky diodes direct power from the remaining power source to supply power to all of the output connections 16. The heat generating components 26 of the system are preferably coupled to the heat sink 20 with a layer of thermal silicone paste to improve thermal conduction from the component 26 to the heat sink 20.

As shown in the FIGURES, the system may include fuse alarm signals 42 to indicate when a fuse has failed. Power ON green LEDs 39 indicate power is flowing uninterrupted to the panel. Mounting brackets 36 extending from the side surfaces of the fuse panel allow for simple installation of the fuse panel onto a rack or frame.

Integrating a portion of the fuse panel 1 with the heat sink 20 and attaching the heat generating component directly to that portion of the fuse panel is advantageous over prior convection heat sinks which are enclosed within the fuse panel. First, the heat sink is exposed directly to outside air which improves heat dissipation and more efficient heat convection away from the panel. Further, access to the circuitry of the fuse panel is greatly improved during assembly, installation, and maintenance. Also, due to the configuration of the heat sink as a portion of the fuse panel surface, the strength of the fuse panel surface is increased. Further yet, the fuse panel of the present invention is less expensive to construct than prior art systems.

In the preferred embodiment, with the exception of the heat sink 20, a remainder of housing 2 is made of sheet metal. The heat sink 20 may be made of extruded aluminum and may be anodized coated.

Figure 8:
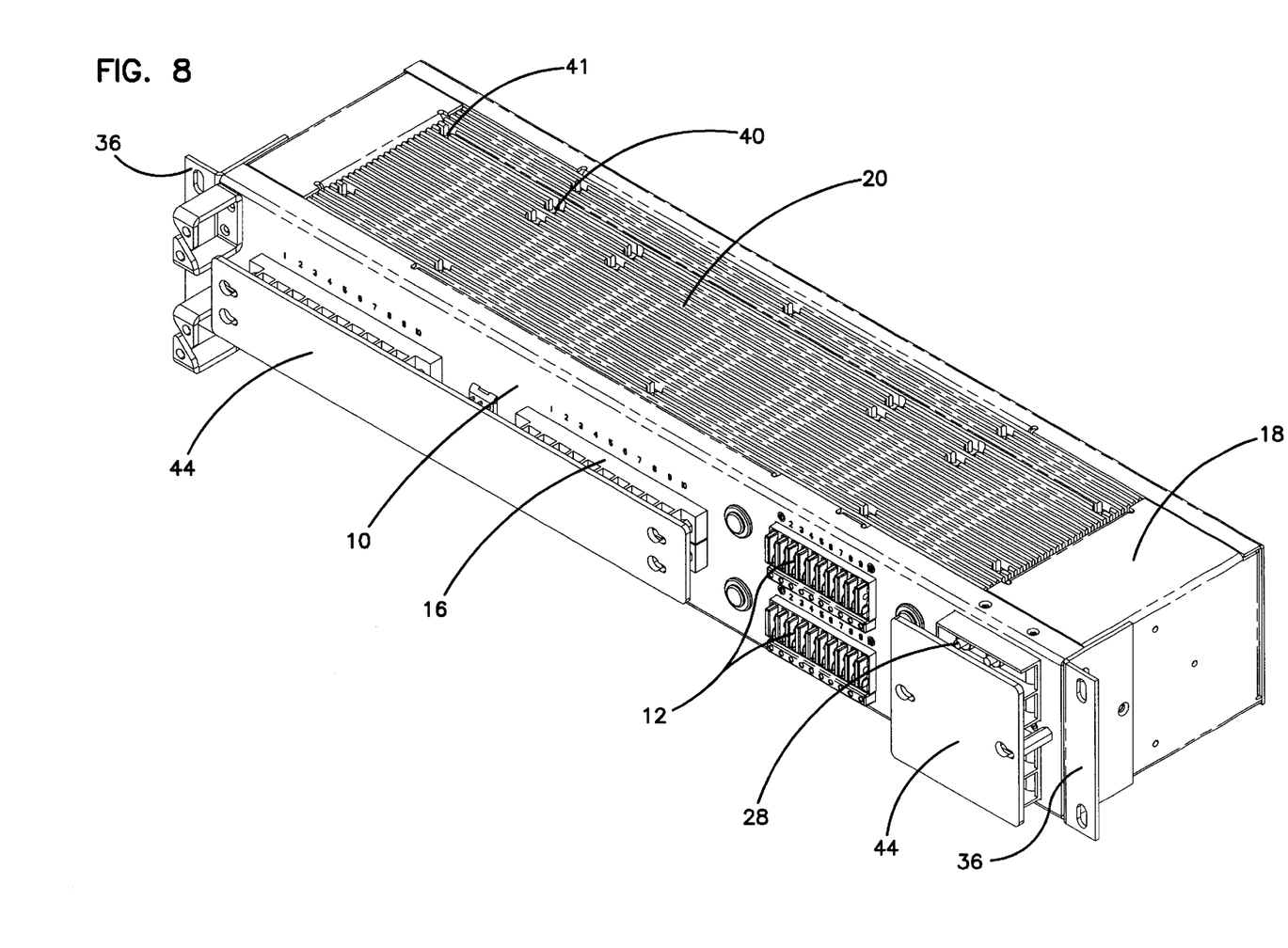
FIG. 8 is a perspective view of a second preferred embodiment of a power distribution panel with heat sink according to the present invention.
Figure 9:
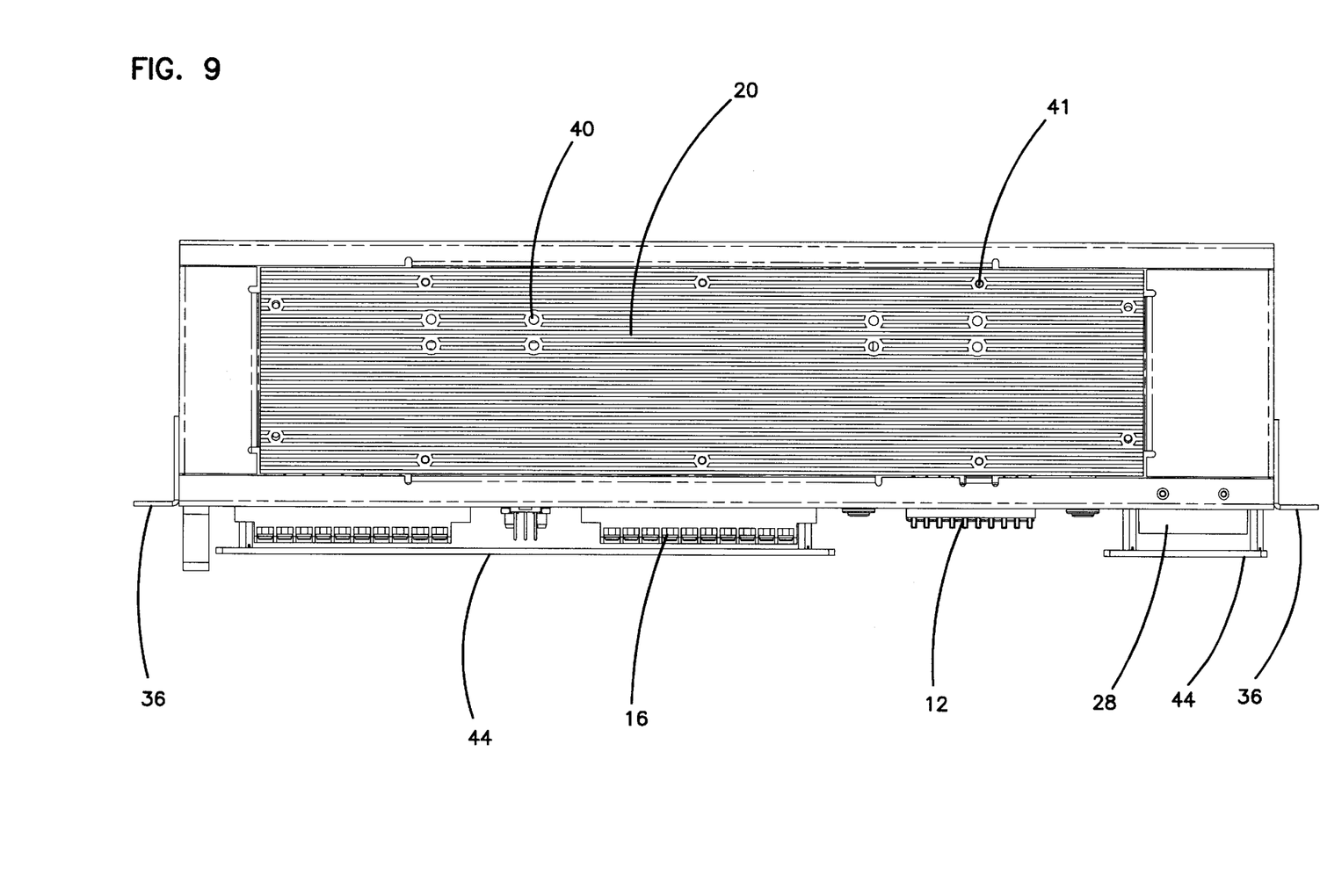
FIG. 9 is a top view of the second preferred embodiment of the power distribution panel with heat sink according to the present invention.

The dimensions and components of the present invention may be altered depending on the desired application. FIGS. 8 and 9 show a second embodiment of the present system in which the power input connections 28, the arrays of fuse holder locations 12, and the arrays of output connector locations 16 are all disposed on the front surface 10 of the power distribution fuse panel. Protective panels 44 may be used as a safety precaution to cover the power input connections 28 and the output connector locations 16.

The above specification provides a description of the present invention. Since many embodiments of the invention can be made without departing from the spirit and scope of the invention, the invention resides in the claims hereinafter appended.

What is claimed is:

1. A power distribution panel comprising:
 a front surface having an array of circuit protection component holders;
 a back surface having an array of output terminals, the back surface also including a power input connection;
 a top surface defining an opening with at least one fastener opening along an edge of the opening;
 a heat sink mounted in the opening of the top surface and closing the opening and held in the opening by at least one fastener received by the at least one fastener opening along the edge of the opening;
 a bottom and two side surfaces which with the front, back, and top surfaces define a housing with an interior of the power distribution panel;
 an electrical circuit disposed within the interior of the power distribution panel, the circuit including a heat generating component;
 wherein the electrical circuit electrically connects the output terminals to the power input connection via the array of circuit protection component holders such that when a circuit protection component is installed in a circuit protection component holder a corresponding output terminal is supplied with electric power from the power input connection;
 wherein the heat generating component of the internal circuit is in heat conductive contact with the heat sink.

2. The power distribution panel of claim 1, wherein the circuit protection component holders are fuse holders and fuses are mounted at the circuit protection component holders.

3. The power distribution panel of claim 1, wherein the circuit protection component holders are circuit breaker holders and circuit breakers are mounted at the circuit protection component holders.

4. The power distribution panel of claim 1, wherein the heat sink has a top side and a bottom side, the top side defining a plurality grooves.

5. The power distribution panel of claim 1, wherein the heat generating component of the internal circuit is a Schottky rectifier.

6. The power distribution panel of claim 1, further comprising a mounting bracket extending from each of the side surfaces of the power distribution panel for mounting to a rack.

7. The power distribution panel of claim 1, wherein the top surface further defines a series of openings which allow heated air to escape the interior of the power distribution panel.

8. The power distribution panel of claim 1, further comprising an LED signal to indicate when a circuit protection component has failed, and an LED signal to indicate when power is flowing uninterrupted to the power distribution panel.

9. The power distribution panel of claim 1, wherein the heat sink and the top surface form a generally planar top surface for the panel.

10. A power distribution panel comprising:
a front surface including an array of circuit protection component holders, an array of output terminals, and a power input connection;
a back surface;
a top surface defining an opening with at least one fastener opening along an edge of the opening;
a heat sink mounted in the opening of the top surface and closing the opening and held in the opening by at least one fastener received by the at least one fastener opening along the edge of the opening;
a bottom surface;
two side surfaces;
wherein the front, back, top, bottom, and side surfaces define a housing with an interior of the power distribution panel;
an electrical circuit disposed in the interior of the power distribution panel, the circuit including a heat generating component;
wherein the electrical circuit electrically connects the output terminals to the power input connection via the array of circuit protection component holders such that when a circuit protection component is installed in a circuit protection component holder a corresponding output terminal is supplied with electric power from the power input connection;
wherein the heat generating component of the internal circuit is in heat conductive contact with the heat sink.

11. The power distribution panel of claim 10, wherein the circuit protection component holders are fuse holders and fuses are mounted at the circuit protection component holders.

12. The power distribution panel of claim 10, wherein the circuit protection component holders are circuit breaker holders and circuit breakers are mounted at the circuit protection component holders.

13. The power distribution panel of claim 10, wherein the heat sink has a top side and a bottom side, the top side defining a plurality grooves.

14. The power distribution panel of claim 10, wherein the heat generating component of the internal circuit is a Schottky rectifier.

15. The power distribution panel of claim 10, wherein the top surface further defines a series of vents which allow air to pass between an interior of the unit housing and an exterior of the unit housing.

16. The power distribution panel of claim 10, further comprising a mounting bracket extending from each of the side surfaces of the power distribution panel for mounting to a rack.

17. The power distribution panel of claim 10, further comprising an LED signal to indicate when a circuit protection component has failed, and an LED signal to indicate when power is flowing uninterrupted to the power distribution panel.

18. The power distribution panel of claim 10, wherein the heat sink and the top surface form a generally planar top surface for the panel.

19. A power distribution panel comprising:
a unit housing having a plurality of surfaces defining an interior of the unit housing and wherein a portion of at least one of the surfaces of the unit housing comprises a heat sink;
the heat sink defined as a separate component and the unit housing defining a recess to receive the heat sink;
an array of circuit protection component holders disposed on a surface of the unit housing;
an array of output terminals disposed on a surface of the unit housing;
a power input connection disposed on a surface of the unit housing;
an electrical circuit disposed within the unit housing, the circuit including a heat generating component;
wherein the electrical circuit electrically connects the output terminals to the power input connection via the array of circuit protection component holders such that when a circuit protection component is installed in a circuit protection component holder a corresponding output terminal is supplied with electric power from the power input connection;
wherein the heat generating component of the internal circuit is in heat conductive contact with the heat sink.

20. The power distribution panel of claim 19, wherein the circuit protection component holders are fuse holders and fuses are mounted at the circuit protection component holders.

21. The power distribution panel of claim 19, wherein the circuit protection component holders are circuit breaker holders and circuit breakers are mounted at the circuit protection component holders.

22. An uninterrupted power distribution and fuse panel comprising:
a front surface having first and second arrays of fuse holders;
a back surface having first and second arrays of output terminals, the back surface also comprising first and second power input connections;
a top surface at least a portion of which is comprised of a heat sink, the heat sink defined as a separate component and the top surface defining a recess to receive the heat sink;
a bottom surface;
two side surfaces;
an electrical circuit electrically connecting each output terminal to both power input connections by means of a corresponding fuse holder;
wherein the electrical circuit includes first and second Schottky rectifiers configured with the electrical circuit so that when the first power input connection fails to supply power to the first array of output terminals the second Schottky rectifier acts to provide power from the second power input to both arrays of output terminals, and, likewise, when the second power input connection fails to supply power to the second array of output terminals the first Schottky rectifier acts to provide power from the first power input connection to both arrays of output terminals;
wherein the Schottky rectifiers are heat conductively coupled to the heat sink.

23. A circuit panel comprising:
a unit housing having a plurality of surfaces defining an interior of the unit housing and wherein a portion of at least one of the surfaces of the unit housing comprises a heat sink, the heat sink defined as a separate component and the unit housing defining a recess to receive the heat sink;
a power input connection disposed on a surface of the unit housing;
an output terminal disposed on a surface of the unit housing;

an electrical circuit disposed within the unit housing, the circuit including a heat generating component;

wherein the electrical circuit electrically connects the output terminal to the power input connection;

wherein the heat generating component of the electrical circuit is in heat conductive contact with the heat sink.

24. A power distribution panel comprising:

a front surface having an array of circuit protection component holders;

a back surface having an array of output terminals, the back surface also including a power input connection;

a top surface at least a portion of which is comprised of a heat sink;

a bottom and two side surfaces which with the front, back, and top surfaces define a housing with an interior of the power distribution panel;

the heat sink defined as a separate component and the housing defining a recess to receive the heat sink the heat sink and the top surface forming a generally planar top surface for the panel;

an electrical circuit disposed within the interior of the power distribution panel, the circuit including a heat generating component;

wherein the electrical circuit electrically connects the output terminals to the power input connection via the array of circuit protection component holders such that when a circuit protection component is installed in a circuit protection component holder a corresponding output terminal is supplied with electric power from the power input connection;

wherein the heat generating component of the internal circuit is in heat conductive contact with the heat sink.

25. A power distribution panel comprising:

a front surface having an array of circuit protection component holders;

a back surface having an array of output terminals, the back surface also including a power input connection;

a top surface at least a portion of which is comprised of a heat sink;

a bottom and two side surfaces which with the front, back, and top surfaces define a housing with an interior of the power distribution panel;

the heat sink having a top side and a bottom side, the top side defining a plurality of grooves;

an electrical circuit disposed within the interior of the power distribution panel, the circuit including a heat generating component;

wherein the electrical circuit electrically connects the output terminals to the power input connection via the array of circuit protection component holders such that when a circuit protection component is installed in a circuit protection component holder a corresponding output terminal is supplied with electric power from the power input connection;

wherein the heat generating component of the internal circuit is in heat conductive contact with the heat sink.

26. A power distribution panel comprising:

a front surface including an array of circuit protection component holders, an array of output terminals, and a power input connection;

a top surface at least a portion of which is comprised of a heat sink;

a bottom surface;

a bottom and two side surfaces which with the front, back, and top surfaces define a housing with an interior of the power distribution panel;

the heat sink defined as a separate component and the housing defining a recess to receive the heat sink;

the heat sink and the top surface forming a generally planar top surface for the panel;

an electrical circuit disposed in the interior of the power distribution panel, the circuit including a heat generating component;

wherein the electrical circuit electrically connects the output terminals to the power input connection via the array of circuit protection component holders such that when a circuit protection component is installed in a circuit protection component holder a corresponding output terminal is supplied with electric power from the power input connection;

wherein the heat generating component of the internal circuit is in heat conductive contact with the heat sink.

27. A power distribution panel comprising:

a front surface including an array of circuit protection component holders, an array of output terminals, and a power input connection;

a top surface at least a portion of which is comprised of a heat sink;

a bottom surface;

a bottom and two side surfaces which with the front, back, and top surfaces define a housing with an interior of the power distribution panel;

the heat sink having a top side and a bottom side, the top side defining a plurality of grooves;

an electrical circuit disposed in the interior of the power distribution panel, the circuit including a heat generating component;

wherein the electrical circuit electrically connects the output terminals to the power input connection via the array of circuit protection component holders such that when a circuit protection component is installed in a circuit protection component holder a corresponding output terminal is supplied with electric power from the power input connection;

wherein the heat generating component of the internal circuit is in heat conductive contact with the heat sink.

* * * * *